(12) United States Patent
Huang

(10) Patent No.: US 8,928,834 B2
(45) Date of Patent: Jan. 6, 2015

(54) PRINTED CIRCUIT BOARD AND LIQUID CRYSTAL DISPLAY MODULE

(75) Inventor: Chong Huang, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 236 days.

(21) Appl. No.: 13/380,901

(22) PCT Filed: Dec. 5, 2011

(86) PCT No.: PCT/CN2011/083437
§ 371 (c)(1),
(2), (4) Date: Dec. 26, 2011

(87) PCT Pub. No.: WO2013/078698
PCT Pub. Date: Jun. 6, 2013

(65) Prior Publication Data
US 2013/0135552 A1    May 30, 2013

(30) Foreign Application Priority Data
Nov. 29, 2011  (CN) .......................... 2011 1 0387602

(51) Int. Cl.
*G02F 1/1333*    (2006.01)
(52) U.S. Cl.
USPC .......................................................... 349/58
(58) Field of Classification Search
None
See application file for complete search history.

(56) References Cited

U.S. PATENT DOCUMENTS

| 6,229,584 | B1 * | 5/2001 | Chuo et al. | 349/58 |
| 2007/0247870 | A1 * | 10/2007 | Sakai et al. | 362/612 |

FOREIGN PATENT DOCUMENTS

| CN | 1664674 A | 9/2005 |
| CN | 101509625 A | 8/2009 |
| CN | 201359668 Y | 12/2009 |
| CN | 201425819 Y | 3/2010 |
| CN | 201518190 U | 6/2010 |
| CN | 201757332 U | 3/2011 |
| JP | 11144946 A * | 5/1999 |

* cited by examiner

*Primary Examiner* — Wen-Ying P Chen
(74) *Attorney, Agent, or Firm* — Cheng-Ju Chiang

(57) ABSTRACT

A printed circuit board (PCB) and an LCD (liquid crystal display) module are disclosed. The PCB comprises at least one magnetic hole and at least one magnetic element, and the at least one magnetic element is fixedly disposed in the at least one magnetic hole. The LCD module comprises a backplate and a PCB. The PCB is fixed to the backplate by means of at least one magnetic element, and comprises at least one magnetic hole and the at least one magnetic element fixedly disposed in the at least one magnetic hole. The PCB and the LCD module of the present disclosure can improve the efficiency of fixing and assembling the PCB of the LCD module, make it convenient to re-process and assemble the LCD module and reduce the complexity of the backplate structure. Thereby, the production efficiency is greatly improved.

9 Claims, 2 Drawing Sheets

PRINTED CIRCUIT BOARD AND LIQUID CRYSTAL DISPLAY MODULE

FIELD OF THE INVENTION

The present disclosure generally relates to the field of displaying technologies, and more particularly, to a printed circuit board (PCB) and a liquid crystal display (LCD) module.

BACKGROUND OF THE INVENTION

A liquid crystal display (LCD) module of a conventional thin film transistor LCD (TFT-LCD) requires use of a chip on board (COB) on a printed circuit board (PCB) in LCD devices. Corresponding signals for the LCD module are converted by the COB and then outputted to an LCD panel so as to drive the LCD panel to display a desired image.

The prior art LCD module comprises a backplate, a PCB and a PCB cover-plate. The PCB is fixed on the backplate, and the PCB cover-plate is fixed to the backplate. Currently, most of LCD modules use a galvanized steel sheet as the backplate, and the PCB is usually fixed by use of screws or by use of springy clips in combination with a corresponding backplate partition structure.

However, using the screws to fix the PCB leads to a low assembling efficiency and makes it inconvenient to re-process the PCB; and use of the springy clips in combination with the corresponding backplate partition structure increases the complexity of the backplate structure.

Accordingly, a need exists in the art to provide a PCB that is easy to be fixed and will not increase the complexity of the backplate structure as well as an LCD module comprising the PCB.

SUMMARY OF THE INVENTION

A primary objective of the present disclosure is to provide a PCB and an LCD module, which are intended to improve the fixing and assembling efficiency of the PCB.

To achieve the aforesaid objective, the present disclosure provides a PCB, which comprises at least one magnetic hole; and at least one magnetic element, being fixedly disposed in the at least one magnetic hole.

According to a preferred embodiment of the present disclosure, the at least one magnetic element is in a form corresponding to that of the at least one magnetic hole.

According to a preferred embodiment of the present disclosure, the at least one magnetic hole is of a circular, elliptical, triangular or rectangular form, and the at least one magnetic element is correspondingly of a circular, elliptical, triangular or rectangular form.

According to a preferred embodiment of the present disclosure, the at least one magnetic element has an area equal to that of the at least one magnetic hole, and is inset in the at least one magnetic hole.

According to a preferred embodiment of the present disclosure, the at least one magnetic element is made of one of a soft magnetic material and a hard magnetic material.

According to a preferred embodiment of the present disclosure, the PCB is formed with at least one locating hole for locating the PCB.

To achieve the aforesaid objective, the present disclosure further provides an LCD module. The LCD module comprises a backplate; and a PCB fixed to the backplate by means of at least one magnetic element. The PCB comprises at least one magnetic hole; and the at least one magnetic element, being fixedly disposed in the at least one magnetic hole.

According to a preferred embodiment of the present disclosure, the at least one magnetic element is in a form corresponding to that of the at least one magnetic hole.

According to a preferred embodiment of the present disclosure, the at least one magnetic hole is of a circular, elliptical, triangular or rectangular form, and the at least one magnetic element is correspondingly of a circular, elliptical, triangular or rectangular form.

According to a preferred embodiment of the present disclosure, the at least one magnetic element has an area equal to that of the at least one magnetic hole, and is inset in the at least one magnetic hole.

According to a preferred embodiment of the present disclosure, the at least one magnetic element is made of one of a soft magnetic material and a hard magnetic material.

According to a preferred embodiment of the present disclosure, the backplate is provided with at least one locating element, and the PCB is provided with at least one locating portion for mating with the at least one locating element.

According to a preferred embodiment of the present disclosure, the at least one locating element is each a locating post protruding from the backplate, and the at least one locating portion is each a locating hole.

To achieve the aforesaid objective, the present disclosure further provides an LCD module, which comprises: a backplate, being provided with at least one locating element; and a PCB, being fixed to the backplate by means of at least one magnetic element and having at least one locating portion for mating with the at least one locating element. The PCB comprises at least one magnetic hole; and the at least one magnetic element, being fixedly disposed in the at least one magnetic hole and being in a form corresponding to that of the at least one magnetic hole.

According to a preferred embodiment of the present disclosure, the at least one magnetic hole is of a circular, elliptical, triangular or rectangular form, and the at least one magnetic element is correspondingly of a circular, elliptical, triangular or rectangular form.

According to a preferred embodiment of the present disclosure, the at least one magnetic element has an area equal to that of the at least one magnetic hole, and is inset in the at least one magnetic hole.

According to a preferred embodiment of the present disclosure, the at least one magnetic element is made of one of a soft magnetic material and a hard magnetic material.

According to a preferred embodiment of the present disclosure, the at least one locating element is each a locating post protruding from the backplate, and the at least one locating portion is each a locating hole.

The present disclosure has the following benefits: as compared to the prior art, the PCB and the LCD module of the present disclosure can improve the efficiency of fixing and assembling the PCB of the LCD module, make it convenient to re-process and assemble the LCD module and reduce the complexity of the backplate structure. Thereby, the production efficiency is greatly improved.

BRIEF DESCRIPTION OF THE DRAWINGS

In order to more clearly describe the technical solutions of the embodiments of the present disclosure, attached drawings to be used in the detailed description of the disclosure will be briefly described hereinbelow. Obviously, the attached drawings described hereinbelow only illustrate some of the embodiments of the present disclosure, and those of ordinary skill in the art can also obtain other attached drawings therefrom without the need of making inventive efforts, wherein.

DETAILED DESCRIPTION OF THE INVENTION

Figure 1:
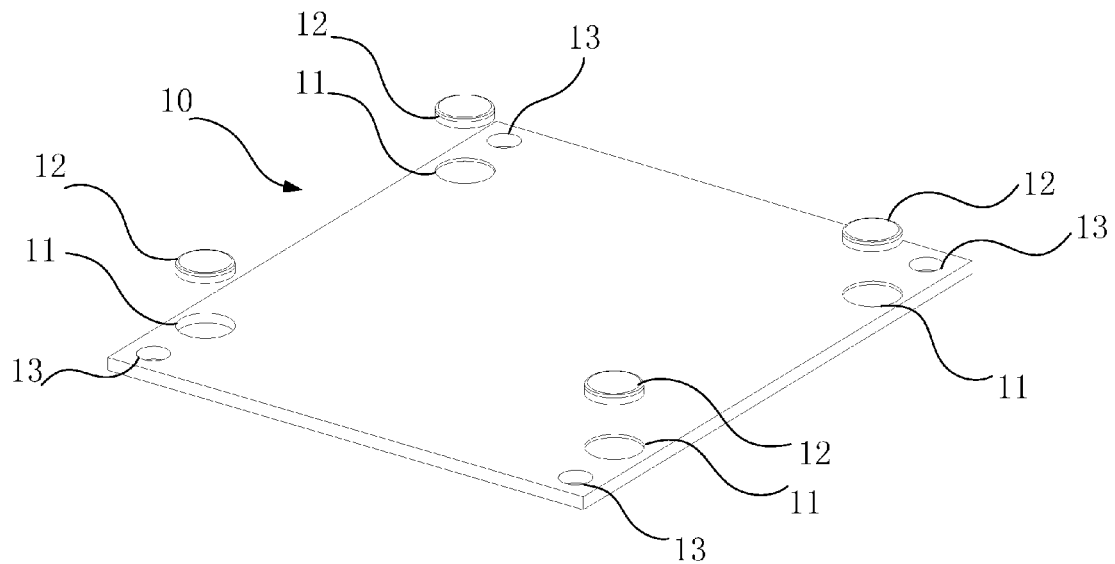
FIG. 1 is an exploded view of a PCB according to a preferred embodiment of the present disclosure.

Various embodiments of the disclosure are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Hereinbelow, the technical solutions of embodiments of the present disclosure will be described clearly and completely with reference to the attached drawings. Obviously, the embodiments described herein are only some of the embodiments of the present disclosure but do not represent all embodiments of the disclosure. All other embodiments that can be devised by those of ordinary skill in the art on the basis of the embodiments described herein and without making inventive efforts shall fall within the scope of the present disclosure.

Referring to FIG. 1, an exploded view of a PCB according to a preferred embodiment of the present disclosure is shown therein. As shown in FIG. 1, this embodiment of the present disclosure provides a PCB 10, which comprises at least one magnetic hole 11 and at least one magnetic element 12. Of course, the PCB 10 further comprises prior art circuit structures, which will not be further described herein because these structures are unrelated to the present disclosure.

The at least one magnetic element 12 is in a form corresponding to that of the at least one magnetic hole 11. When the at least one magnetic hole 11 is of a circular, elliptical, triangular or rectangular form, the at least one magnetic element 12 is correspondingly of a circular, elliptical, triangular or rectangular form. Of course, the aforesaid forms are just listed as examples, and the magnetic hole and the magnetic element may also be of other forms as long as the forms thereof match with each other.

Figure 2:
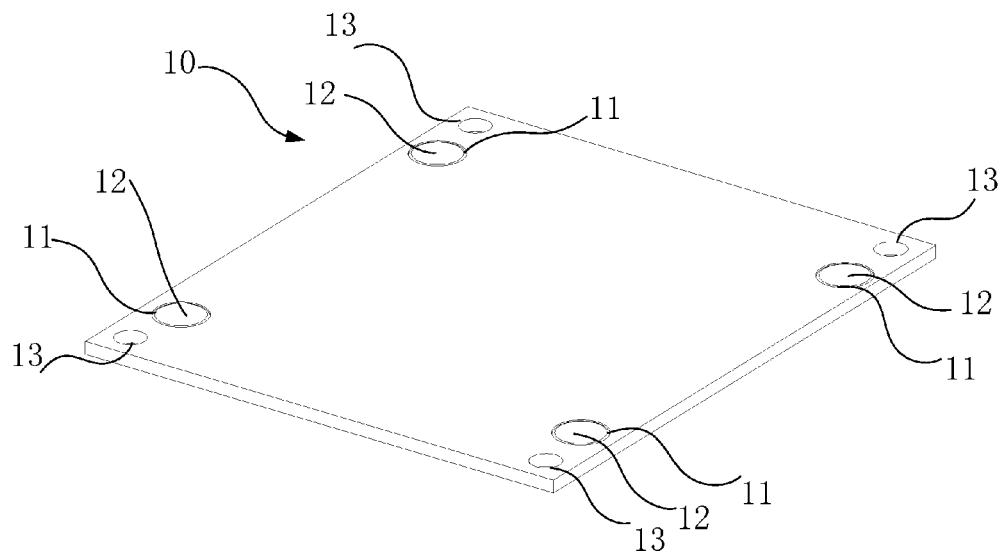
FIG. 2 is a schematic assembly diagram of the PCB as shown in FIG. 1.

FIG. 2 is a schematic assembly diagram of the PCB shown in FIG. 1. As shown in FIG. 2, the at least one magnetic element 12 is fixedly disposed in the at least one magnetic hole 11. In this embodiment, the at least one magnetic element 12 has an area equal to that of the at least one magnetic hole 11, and is inset in the at least one magnetic hole 11. Of course, in other embodiments, the at least one magnetic element 12 may also be disposed in the at least one magnetic hole 11 in a conventional way such as adhesion. As will be readily appreciated by people skilled in the art, the at least one magnetic element 12 may be further bonded with the PCB 10 (e.g., through use of a superglue) after being inset in the at least one magnetic hole 11 so as to ensure the stability of the connection therebetween. Here, the insetting may be accomplished through a conventional means such as interference fitting or snap fitting.

The at least one magnetic element 12 may be made of a soft magnetic material and a hard magnetic material known in the prior art, and this will not be further described herein.

In this embodiment, the PCB 10 is further formed with at least one locating hole 13. The at least one locating hole 13 is used for locating the PCB 10 when the PCB 10 is assembled.

In this embodiment, the at least one magnetic element 12 and the at least one locating hole 13 are both disposed at four corners of the PCB 10. Of course, in other embodiments, the positions of the at least one magnetic element 12 and the at least one locating hole 13 are not limited to the four corners; and for example, the magnetic element may also be disposed at an edge of the PCB.

Figure 3:
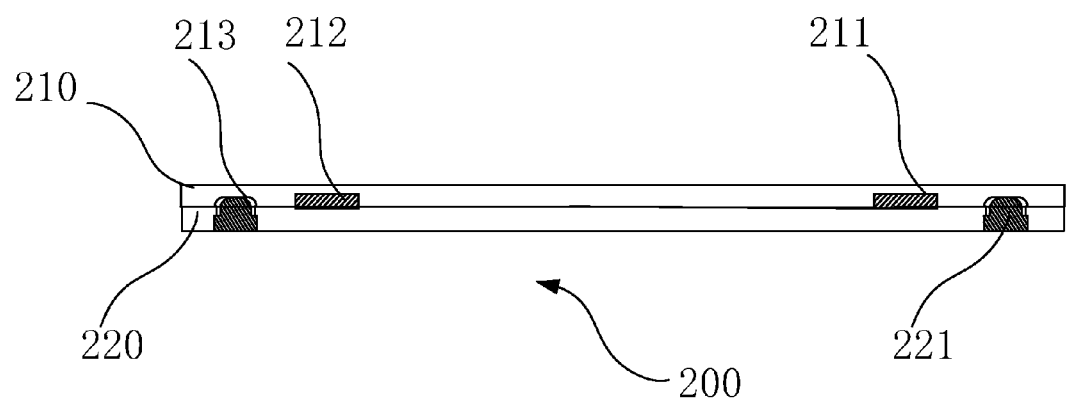
FIG. 3 is a schematic cross-sectional structural view of an LCD module according to a preferred embodiment of the present disclosure.

Another embodiment of the present disclosure further provides an LCD module. Referring to FIG. 3, a schematic cross-sectional structural view of an LCD module according to a preferred embodiment of the present disclosure is shown therein. The LCD module 200 comprises a PCB 210 and a backplate 220.

For the technical features of the PCB 210, reference may be made to the descriptions of the PCB 10 of the present disclosure, and no further descriptions will be made herein. In this embodiment, the PCB 210 comprises at least one magnetic hole 211, at least one magnetic element 212 and at least one locating hole 213. As most backplates of the prior art LCD modules are made of a metallic material such as electrolytic galvanized steel sheet (SECC), the PCB 210 of the LCD module 200 of the present disclosure can also be fixed to the backplate 220 by means of the magnetic element 212 disposed on the PCB 210.

At a position on the backplate 220 corresponding to the at least one locating hole 213 of the PCB 210 is disposed a locating post 221 protruding from the backplate 220, and the PCB 210 can be assembled accurately and conveniently by use of the locating post 221 in combination with the at least one locating hole 213.

Of course, in other embodiments, the backplate may also be provided with other conventionally known locating elements, and the PCB may also be provided with other locating portions for mating with the locating elements.

The PCB and the LCD module of the present disclosure can improve the efficiency of fixing and assembling the PCB of the LCD module, make it convenient to re-process and assemble the LCD module and reduce the complexity of the backplate structure. Thereby, the production efficiency is greatly improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A liquid crystal display (LCD) module, comprising:
a backplate; and
a printed circuit board (PCB) fixed to the backplate by means of at least one magnetic element, comprising:
at least one magnetic hole; and
the at least one magnetic element, being fixedly disposed in the at least one magnetic hole;
wherein the backplate is provided with at least one locating element, and the PCB is provided with at least one locating portion for mating with the at least one locating element;
wherein the at least one locating element is each a locating post protruding from the backplate, and the at least one locating portion is each a locating hole.

2. The LCD module of claim 1, wherein the at least one magnetic element is in a form corresponding to that of the at least one magnetic hole.

3. The LCD module of claim 2, wherein the at least one magnetic hole is of a circular, elliptical, triangular or rectangular form, and the at least one magnetic element is correspondingly of a circular, elliptical, triangular or rectangular form.

4. The LCD module of claim 2, wherein the at least one magnetic element has an area equal to that of the at least one magnetic hole, and is inset in the at least one magnetic hole.

5. The LCD module of claim 1, wherein the at least one magnetic element is made of one of a soft magnetic material and a hard magnetic material.

6. An LCD (liquid crystal display) module, comprising:
- a backplate, being provided with at least one locating element; and
- a printed circuit board (PCB), being fixed to the backplate by means of at least one magnetic element and having at least one locating portion for mating with the at least one locating element, the PCB comprising:
  - at least one magnetic hole; and
  - the at least one magnetic element, being fixedly disposed in the at least one magnetic hole and being in a form corresponding to that of the at least one magnetic hole;
- wherein the at least one locating element is each a locating post protruding from the backplate, and the at least one locating portion is each a locating hole.

7. The LCD module of claim 6, wherein the at least one magnetic hole is of a circular, elliptical, triangular or rectangular form, and the at least one magnetic element is correspondingly of a circular, elliptical, triangular or rectangular form.

8. The LCD module of claim 6, wherein the at least one magnetic element has an area equal to that of the at least one magnetic hole, and is inset in the at least one magnetic hole.

9. The LCD module of claim 6, wherein the magnetic element is made of one of a soft magnetic material and a hard magnetic material.

* * * * *